(12) United States Patent
Hirano

(10) Patent No.: US 7,291,220 B2
(45) Date of Patent: Nov. 6, 2007

(54) PROCESS OF PRODUCING SILICON WAFER

(75) Inventor: Yumiko Hirano, Niigata-ken (JP)

(73) Assignee: Covalent Materials Corporation, Tokyo (JP)

( * ) Notice: Subject to any disclaimer, the term of this patent is extended or adjusted under 35 U.S.C. 154(b) by 90 days.

(21) Appl. No.: 11/206,855

(22) Filed: Aug. 19, 2005

(65) Prior Publication Data

US 2006/0060129 A1    Mar. 23, 2006

(30) Foreign Application Priority Data

Aug. 24, 2004   (JP) .............................. 2004-243957
Jan. 20, 2005   (JP) .............................. 2005-012621

(51) Int. Cl.
*C30B 25/12* (2006.01)

(52) U.S. Cl. .............................. 117/20; 117/19; 117/89

(58) Field of Classification Search ................ 117/19, 117/20, 89
See application file for complete search history.

(56) References Cited

U.S. PATENT DOCUMENTS 7,048,796 B2 *    5/2006   Watanabe et al. ............. 117/19

FOREIGN PATENT DOCUMENTS

| EP | 0 942 078 A1 | 9/1999 |
| EP | 1 391 921 A1 | 2/2004 |
| JP | 11-322491 A | 11/1999 |
| JP | 2001-284362 A | 10/2001 |

* cited by examiner

*Primary Examiner*—Felisa Hiteshew
(74) *Attorney, Agent, or Firm*—Foley & Lardner LLP

(57) ABSTRACT

A silicon wafer made by the Czochralski method, including a ring-shaped OSF region and having nitrogen concentration ranging from $2.9 \times 10^{14}$ to $5.0 \times 10^{15}$ atoms/cm$^3$ and oxygen concentration of $1.27 \times 10^{18}$ to $3.0 \times 10^{18}$ atoms/cm$^3$ is heat-treated in a reducing-gas or inert-gas atmosphere, by increasing the temperature at the rate of 0.5° C./min to 2.0° C./min until the wafer is heated to a heat-treatment temperature of 1000 to 1200° C.

3 Claims, 3 Drawing Sheets

PROCESS OF PRODUCING SILICON WAFER

CROSS-REFERENCE TO RELATED APPLICATIONS

This application is based upon and claims the benefit of priority from the prior Japanese Patent Applications No. 2004-243957, filed on 24$^{th}$ Aug. 2004 and No. 2005-012621, filed on 20$^{th}$ Jan. 2005, the entire contents of which are incorporated herein by reference.

BACKGROUND OF THE INVENTION

1. Field of the Invention

The present invention relates to a process of producing a silicon wafer. More particularly, the invention relates to a process of producing a silicon wafer that can have within-wafer uniformity of BMD (Bulk Micro Defect) density even if a ring-shaped OSF (Oxidation Induced Stacking Fault) region has been formed in the course of growing a single crystal by the Czochralski method.

2. Description of the Related Art

To produce a silicon wafer (hereinafter simply referred to as "wafer") for use as a substrate in which semiconductor elements are to be formed, the Czochralski method (hereinafter simply referred to as "CZ method") is generally employed. In the CZ method, a seed crystal is immersed in the melt heated in a crucible and pulled up while it and the crucible are being rotated. With the CZ method, however, it is extremely difficult to make the crystal grow to have uniform characteristic with respect to oxygen concentration.

To attain IG (Intrinsic Gettering) effect that accomplishes the gettering of impurities such as heavy metals present in the crystal surface of the wafer, a specific technique is generally utilized. In this technique, a single crystal grown by the CZ method is sliced into wafers. The wafers are subjected to planarization and then to a high-temperature heat treatment in a reducing atmosphere or inert-gas atmosphere. A denuded zone is thereby formed in the surface of the wafer, to a thickness of about 20 μm from the wafer surface. The BMD density of the wafer is thereby enhanced, too.

In recent years, it has become possible to form semiconductor elements smaller and, thus, in higher integration density. It is therefore increasingly demanded that wafers should have within-wafer uniformity of BMD density.

As known in the art, in the process of growing a single crystal grow by the CZ method, the ratio (V/G) of the speed V of crystal growth to the intra-crystal temperature gradient G at a temperature immediately below the melting point results in a fault-seed region (i.e., void-fault region, ring-shaped OSF (Oxidation-Induced Stacking Fault) region, non-fault region, or dislocation cluster region). Of these fault-seed regions, a ring-shaped OSF region may be formed. In this case, as known in the art, a BMD region having a remarkably low density of precipitated oxygen is formed in the ring-shaped OSF region (i.e., high-BMD density region) and in the vicinity thereof. Consequently, two regions, i.e., a high-BMD-density region and a low-BMD-density region, are formed in the surface of any wafer that has a ring-shaped OSF region formed during the growth of the single crystal. Such a wafer will inevitably have non-uniform BMD density in the surface even if it is heat-treated at high temperature. The low-BMD-density region of the wafer reduces the lifetime and oxide-film withstand voltage and, ultimately, lower the yield of semiconductor devices made by processing the wafer.

A method which improves the within-wafer uniformity of BMD density is available. The method is to control the ratio V/G, thereby to position the ring-shaped OSF region in the outer peripheral part of the wafer in the center part thereof. To achieve this control of V/G, the hot zone must be appropriately shaped or the seed crystal must be pulled up at a precisely correct speed. The control of V/G is difficult to perform successfully and requires high cost.

A technique has been proposed, which may increase the BMD density within wafers. In this technique, a single crystal made by the CZ method and having nitrogen concentration of $0.01 \times 10^{15}$ to $5.0 \times 10^{15}$ atoms/cm$^3$ and oxygen concentration of $0.7 \times 10^{18}$ to $1.4 \times 10^{18}$ atoms/cm$^3$ is heat-treated for 10 minutes or more at 1000 to 1400° C. (See, for example, Jpn. Pat. Appln. Laid-Open Publication No. 2001-284362.)

Another technique has been proposed, in which a single crystal having nitrogen concentration of $1 \times 10^{10}$ to $5.0 \times 10^{15}$ atoms/cm$^3$ and oxygen concentration of at most $1.2 \times 10^{18}$ atoms/cm$^3$ is heat-treated at a temperature equal to or lower than the melting point of silicon. (See, for example, Jpn. Pat. Appln. Laid-Open Publication No. 11-322491.)

These patent publications disclose processes of producing single-crystal silicon wafers that have high BMD density and exhibit sufficient IG effect. However, they neither disclose nor suggest any means for enhancing the within-wafer uniformity of BMD density of a wafer that has a ring-shaped OSF region formed in the surface.

BRIEF SUMMARY OF THE INVENTION

An object of the present invention is to provide a process of producing a high-quality silicon wafer at high yield, because the within-wafer uniformity of BMD density is high even if the wafer has a ring-shaped OSF region formed in the process of pulling up the single crystal in the CZ method.

The present invention may provide a process of producing a silicon wafer from a single-crystal prepared by the Czochralski method, which comprises:

(1) including a ring-shaped OSF region and having nitrogen concentration ranging from $2.9 \times 10^{14}$ to $5.0 \times 10^{15}$ atoms/cm$^3$ and oxygen concentration of $1.27 \times 10^{18}$ to $3.0 \times 10^{18}$ atoms/cm$^3$;

(2) inserting the silicon wafer into a heat-treatment furnace in which the temperature was maintained at 600 to 800° C. in a reducing-gas or inert-gas atmosphere; and (3) heat-treating the wafer, while maintaining the rate of increasing the temperature at 0.5° C./min to 2.0° C./min until the wafer is heated to a heat-treatment temperature of 1000 to 1200° C.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE INVENTION

Figure 1:
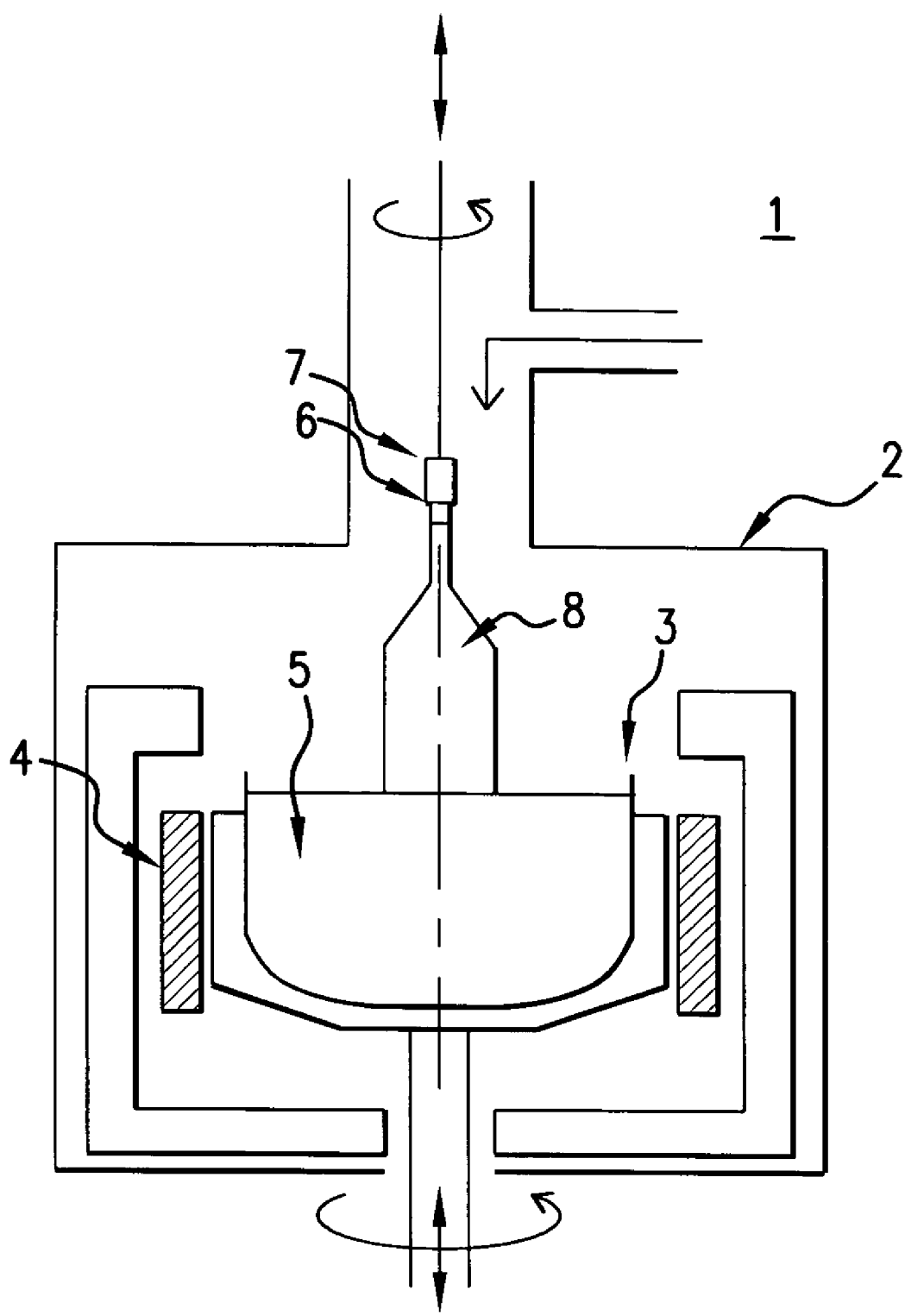
FIG. 1 is a conceptual view of an apparatus for pulling up a single crystal, which is employed in the silicon-single-crystal growing process according to an embodiment of this invention.

An embodiment of the invention will be described below.

In a process of producing a silicon wafer, according to the present invention, polysilicon, silicon nitride and silicon dioxide are filled in a quartz crucible 3 placed in the chamber 2 of a single-crystal pulling apparatus 1. Polysilicon is the material for a single crystal. Silicon nitride is used to dope silicon with nitride. Silicon dioxide is used to dope silicon with oxygen. These materials are filled in the crucible 3 in such amount that the resultant mixture may have desired nitrogen concentration and desired oxygen concentration. Next, the mixture is heated and melt, providing a melt 5. A seed crystal 6 is immersed in the melt 5 and held by a seed chuck 7. The seed chuck 7 holding the seed crystal 6 is pulled upwards, while the chuck 7 and the crucible 3 are being rotated. Thus, the seed crystal 6 grows into a single crystal 8 of silicon.

Subsequently, the silicon single crystal 8 thus grown is sliced into wafers by the method known in the art. The wafers are subjected to lapping, etching and polishing. The wafers therefore acquire smooth flat surfaces.

Next, the wafers are laid one above another in a heat-treatment furnace of the type generally used, for example a vertical boat. The wafers are heat-treated in a reducing-gas atmosphere or inert-gas atmosphere for at least 10 minutes, at a temperature gradually increasing to 1000 to 1200° C. at a specific rate.

To evaluate the BMD density of the wafers thus produced, a method is usually employed, in which each wafer is heat-treated, detecting and visualizing BMDs, and the BMDs are measured by the infrared laser scattering tomography. This method is widely utilized to evaluate the quality of the wafers available on the market. To detect BMD density at higher precision, particularly, to detect BMDs that are too small to be detected by infrared laser scattering tomography, an X-ray topography is employed. In the X-ray topography, X rays are applied to the wafers, and the X rays passing through the wafers are photographed on OHP film, and the resultant photograph is visually examined for the presence or absence of defects. However, the X-ray topography is not fit for evaluation of the wafers available on the market, because it takes a long time to examine each photograph. This is why X-ray topography is widely used to evaluate wafers in research and development.

It is desired that the silicon single crystal 8 grown by the CZ method should have nitrogen concentration of $2.9 \times 10^{14}$ to $5.0 \times 10^{15}$ atoms/cm$^3$ and oxygen concentration of $1.27 \times 10^{18}$ to $3.0 \times 10^{18}$ atoms/cm$^3$. Each wafer made by slicing the crystal 8, which also has nitrogen concentration and oxygen concentration, both falling within these ranges, is heat-treated in a reducing-gas or inert-gas atmosphere, gradually raising the temperature to 1000 to 1200° C. at the rate of 0.5 to 2.5° C./min. So heat-treated, the wafer can have within-wafer uniformity of BMD density even if a ring-shaped OSF region has been formed in it.

If the silicon single crystal 8 has nitrogen concentration less than $2.9 \times 10^{14}$ atoms/cm$^3$, the wafer cannot acquire within-wafer uniformity of BMD density after it is heat-treated if a ring-shaped OSF region has been formed in the course of growing the single crystal. If the silicon single crystal 8 has nitrogen concentration exceeding $5.0 \times 10^{15}$ atoms/cm$^3$, the single-crystallization in the course of growing the single crystal silicon will be suppressed, making it impossible to grow a single crystal. If the silicon single crystal 8 has oxygen concentration less than $1.27 \times 10^{18}$ atoms/cm$^3$, the wafer cannot acquire within-wafer uniformity of BMD density after it is heat-treated, if a ring-shaped OSF region has been formed in the course of growing the single crystal. If the silicon single crystal 8 has oxygen concentration exceeding $3.0 \times 10^{18}$ atoms/cm$^3$, the wafer cannot have so low an oxygen concentration as is desired to provide semiconductor devices composed of small elements and thus having high integration density. In this case, the wafer is not practically useful.

The silicon single crystal 8 grown to have nitrogen concentration and oxygen concentration, both falling within the above-specified ranges, is sliced into wafers. The wafers are subjected to lapping, etching and polishing. As a result, the wafers acquire smooth flat surfaces.

Each wafer having smooth flat surfaces is inserted into, for example, a vertical heat-treatment furnace. It is desired that the temperature in the heat-treatment furnace be maintained at 600 to 800° C. when the wafer is inserted into the furnace.

If the temperature in the heat-treatment furnace is less than 600° C. when the wafer is inserted into the furnace, a thermal donor will be formed in the wafer, which is not desirable. If the temperature exceeds 800° C., the difference between the temperature and that of the wafer will be excessively large. The wafer or the like will undergo an abrupt temperature change and will be deformed. If the wafer is deformed, slip will develop in the wafer after the wafer is heat-treated. This is not desirable, either.

After inserted into the heat-treatment furnace, the wafer is heat-treated in a reducing-gas or inert-gas atmosphere, gradually heated to 1000 to 1200° C. at the rate of 0.5 to 2.0° C./min.

If the temperature-increasing rate is less than 0.5° C./min, the productivity will be very poor, and secondary inconvenience, such as intra-furnace contamination, will occur because the wafer is held in the heat-treatment furnace for a long time. If the temperature-increasing rate exceeds 2.0° C./min, the wafer will fail to acquire within-wafer uniformity of BMD density, if a ring-shaped OSF region has been formed in the course of growing the single crystal. Further, if the heat-treatment temperature is less than 1000° C., the surface region to the depth of about 20 μm from the surface of the wafer cannot be completely free from defects. If the heat-treatment temperature exceeds 1200° C., the holder member holding the wafer will be deformed due to heat during the heat treatment. In this case, slip or the like may develop in the wafer, which is undesirable.

Produced by the process described above, the wafer can have within-wafer uniformity of BMD density.

The silicon single crystal 8 may have nitrogen concentration of $4.4 \times 10^{14}$ to $5.0 \times 10^{15}$ atoms/cm$^3$ and oxygen concentration of $1.15 \times 10^{18}$ to $3.0 \times 10^{18}$ atoms/cm$^3$. In this case, too, the same advantages can be attained as it has been grown to acquire the nitrogen concentration and oxygen concentration specified above. That is, since the nitrogen concentration of $4.4 \times 10^{14}$ to $5.0 \times 10^{15}$ atoms/cm$^3$, each wafer can have within-wafer uniformity of BMD density after heat-treated, even if the oxygen concentration is lowered to $1.15 \times 10^{18}$ atoms/cm$^3$.

It is preferable that, the silicon single crystal 8 has nitrogen concentration of $8.0 \times 10^{14}$ to $5.0 \times 10^{15}$ atoms/cm$^3$ and oxygen concentration of $1.35 \times 10^{18}$ to $3.0 \times 10^{18}$ atoms/cm$^3$. In this case, wafers made by slicing the crystal 8, will have even higher quality. That is, they have within-wafer uniformity of BMD density, as determined by not only infrared tomography but also by X-ray topography that can evaluate the wafer more precisely than infrared tomography, even if a ring-shaped OSF region has been formed in the course of growing the single crystal, provided that the wafers are inserted into a heat-treatment furnace in which the temperature is maintained at 600 to 800° C., and are heat-treated in reducing-gas or inert-gas atmosphere, gradually heated to 1000 to 1200° C. at the rate of 0.5 to 2.0° C./min.

The above-mentioned reducing gas includes hydrogen gas, nitrogen gas, hydrochloric gas, and the like. The aforementioned inert gas includes helium gas, argon gas, and the like.

The process described above can produce high-quality wafers that have within-wafer uniformity of BMD density even if a ring-shaped OSF region has been formed in the course of growing the single crystal. This is probably because the BMD nuclei grow in the low BMD-density region as each wafer obtained by slicing the single crystal having a nitrogen concentration and oxygen concentration falling within the above-specified ranges, BMDs are thereby induced, and the oxygen atoms are well diffused in the low BMD-density region. As a result of this, the BMD density is rendered uniform in the surface region of the wafer. The nitrogen atoms act as catalyst, diffusing oxygen atoms from the high BMD-density region into the low BMD-density region. The nitrogen concentration is therefore equal to or more than $4.4 \times 10^{14}$. Nitrogen atoms can therefore sufficiently diffuse oxygen atoms even if the oxygen concentration is low.

It should be noted that the apparatus that may be used to grow a single crystal is not limited to the one illustrated in FIG. 1.

EMBODIMENTS

The present invention will further be described in detail, with reference to embodiments. Nevertheless, the invention is not limited by the embodiments that will be described below.

Embodiments 1 to 7, Comparative Example 1

Silicon single crystals were prepared. Each single crystal was made by putting silicon nitride and silicon dioxide into a quartz crucible having a diameter of 22 inches, and by heating the mixture in the crucible. Silicon nitride and silicon dioxide were used in such amounts that the single crystal had the nitrogen concentrations and oxygen concentrations that are shown in Table 1. While each silicon single crystal was being prepared, the V/G was controlled not to form ring-shaped OSF region in the surface region of the wafer.

Next, each silicon single crystal was sliced into wafers. The wafers were inserted into a vertical heat-treatment furnace in which the temperature was maintained at 600° C. In the furnace, the wafers were heat-treated for 60 minutes in an argon atmosphere, gradually heated to 1200° C. at the rate of 1.0° C./min.

The wafers thus heat-treated were subjected to a BMD-inducing process (first at 80° C. for three hours, then at 1000° C. for 16 hours). The wafers were then evaluated for their within-wafer uniformity of BMD density, by means of infrared tomography and X-ray topography. In the infrared tomography method, the BMD density was measured at many points, from the center of each wafer to the outer periphery thereof. The BMD-density within-wafer uniformity of each wafer was calculated (from the max/min values at 30 points over 5 mm in the radial direction of the wafer). Further, in the X-ray topography method, the X-ray photograph of each wafer was visually examined for within-wafer uniformity of BMD density (see FIG. 2A and FIG. 2B). The results were as shown in Table 1.

TABLE 1

| | Nitrogen Concentration ($10^{14}$ atoms/cm$^3$) | Oxygen Concentration ($10^{18}$ atoms/cm$^3$) | Within-Wafer Uniformity in BMD Density | |
|---|---|---|---|---|
| | | | Within-Wafer Ratio of BMD density | Evaluation based on X-Ray Photograph |
| Comp. Ex. 1 | 2.8 | 1.17 | 13.8 | Not uniform |
| Embodiment 1 | 2.9 | 1.27 | 5.2 | Almost uniform |
| Embodiment 2 | 4.4 | 1.19 | 4.6 | Almost uniform |
| Embodiment 3 | 6.5 | 1.35 | 4.9 | Almost uniform |
| Embodiment 4 | 8.0 | 1.15 | 4.7 | Almost uniform |
| Embodiment 5 | 8.0 | 1.35 | 4.5 | Uniform |
| Embodiment 6 | 9.8 | 1.35 | 3.7 | Uniform |
| Embodiment 7 | 12.0 | 1.40 | 3.4 | Uniform |

As seen from Table 1, any embodiment having nitrogen concentration of $2.9 \times 10^{14}$ atoms/cm$^3$ or more and oxygen concentration of $1.27 \times 10^{18}$ atoms/cm$^3$ or more has a much higher ratio of within-wafer BMD density in the infrared tomography than Comparative Example 1. In addition, any embodiment having nitrogen concentration of $4.4 \times 10^{14}$ atoms/cm$^3$ or more has a much higher ratio of within-wafer BMD density than Comparative Example 1, even if the oxygen concentration is $1.15 \times 10^{18}$ atoms/cm$^3$, which is lower than that of Comparative Example 1. Namely, within-wafer uniformity of BMD density can be attained if the nitrogen concentration is $4.4 \times 10^{14}$ atoms/cm$^3$ or more and if the oxygen concentration is $1.15 \times 10^{18}$ atoms/cm$^3$ or more.

Figure 2A:
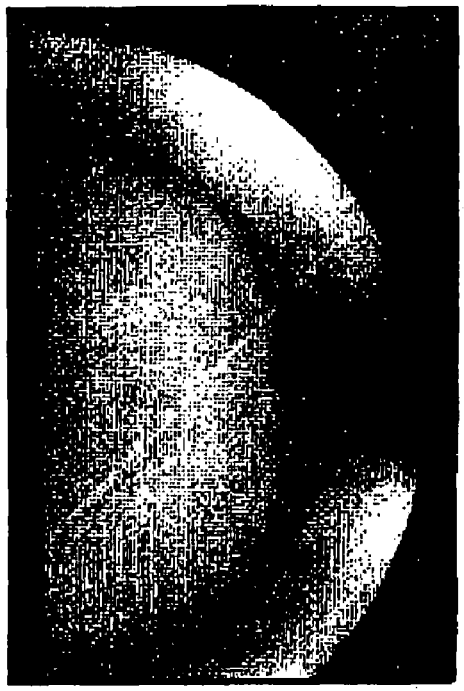
FIG. 2A and FIG. 2B represent X-ray topography photographs prepared to evaluate the silicon wafer produced by a process that is an embodiment of the present invention.
Figure 2B:
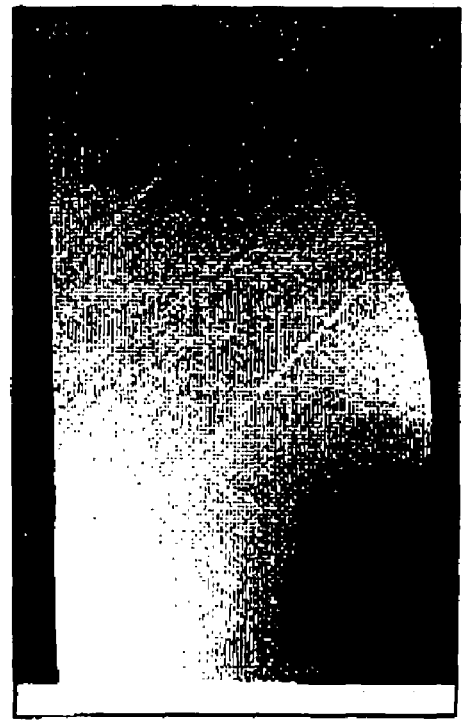

If the nitrogen concentration is $8.0 \times 10^{14}$ atoms/cm$^3$ or more and if the oxygen concentration is $1.35 \times 10^{18}$ atoms/cm$^3$ or more, the non-uniformity of BMD density, observed in FIG. 2A, is no longer confirmed as shown in FIG. 2B. This proves that higher within-wafer uniformity of BMD density has been achieved.

Embodiments 8 to 11, Comparative Examples 2 to 4

Wafers having the same nitrogen concentration and oxygen concentration as Embodiment 1 were inserted into a vertical heat-treatment furnace in which the temperature was maintained at 600° C. In the furnace, these wafers were heat-treated in an argon atmosphere, while the temperature-increasing rate was changed in stepwise, from 0.5° C./min to 3.5° C./min, each time by 0.5° C./min. Thus, there were prepared some samples. The heat treatment was carried out in the same conditions as in Embodiments 1 to 7. That is, the wafers were heat-treated for 60 minutes, gradually heated to 1200° C.

Figure 3:
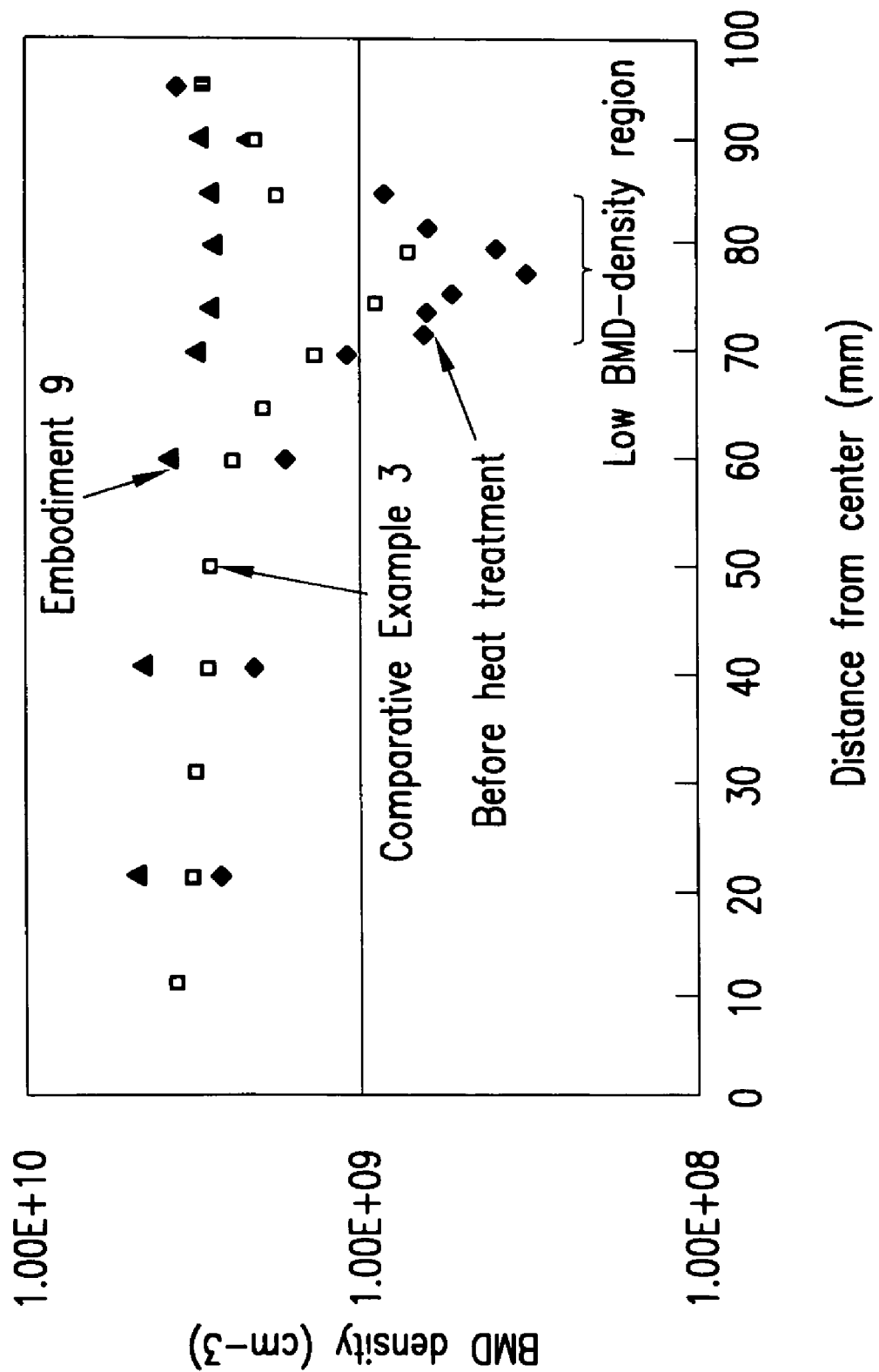
FIG. 3 is a graph showing the BMD-density distribution in a wafer produced by the process of this invention, and the BMD-density distribution in a wafer produced by a comparative process.

The wafers so heat-treated were subjected to the same BMD-inducing process as Embodiments 1 to 7 were subjected. The wafers were then evaluated for their within-wafer uniformity of BMD density, by means of infrared tomography method. The results were as shown in Table 2. FIG. 3 represents the BMD-density profile from the center of the wafer to the outer periphery thereof, for Embodiment 9, Comparative Example 3, and a wafer not heat-treated yet.

TABLE 2

|  | Rate of temperature increase (° C./min) | Ratio of within-wafer BMD density |
| --- | --- | --- |
| Embodiment 8 | 0.5 | 3.5 |
| Embodiment 9 | 1.0 | 3.1 |
| Embodiment 10 | 1.5 | 3.7 |
| Embodiment 11 | 2.0 | 4.5 |
| Comparative Example 2 | 2.5 | 15.0 |
| Comparative Example 3 | 3.0 | 18.0 |
| Comparative Example 4 | 3.5 | 20.0 |

As can be understood from Table 2, the ratio of within-wafer BMD density, determined by the infrared tomography method, is 4.5 (BMDs/cm$^3$) or less if the rate of increasing the temperature ranges from 0.5 to 2.0° C./min. Hence, the within-wafer uniformity of BMD density can be much more improved than in Comparative Examples 2 to 4. If the rate of increasing the temperature ranges from 2.5° C./min or more, the BMD density will be a little higher in Comparative Example 3 than in the wafers not heat-treated, as is illustrated in FIG. 3, in the low BMD-density region. Nonetheless, the within-wafer uniformity of BMD density of Comparative Example 3 is not so high as that of Embodiment 9.

Comparative Examples 5 to 11

Wafers having the same nitrogen concentration and oxygen concentration as Comparative Example 1 were inserted into a vertical heat-treatment furnace in which the temperature was maintained at 600° C. In the furnace, these wafers were heat-treated in an argon atmosphere, while the temperature-increasing rate was changed in stepwise, from 0.5° C./min to 3.5° C./min, each time by 0.5° C./min. Thus, there were prepared some samples. The heat treatment was carried out in the same conditions as in Embodiments 1 to 7. That is, the wafers were heat-treated for 60 minutes, gradually heated to 1200° C.

The wafers so heat-treated were subjected to the same BMD-inducing process as Embodiments 1 to 7 were subjected. The wafers were then evaluated for their within-wafer uniformity of BMD density, by means of infrared tomography method. The results were as shown in Table 3.

TABLE 3

|  | Rate of temperature increase (° C./min) | Ratio of within-wafer BMD density |
| --- | --- | --- |
| Comparative Example 5 | 0.5 | 13.0 |
| Comparative Example 6 | 1.0 | 15.2 |
| Comparative Example 7 | 1.5 | 14.3 |
| Comparative Example 8 | 2.0 | 16.2 |
| Comparative Example 9 | 2.5 | 18.0 |
| Comparative Example 10 | 3.0 | 16.1 |
| Comparative Example 11 | 3.5 | 17.0 |

As seen from Table 3, if wafers having the same nitrogen concentration and oxygen concentration as Comparative Example 1 are heat-treated, they will fail to acquire within-wafer uniformity of BMD density even if the rate of increasing the temperature is lowered to 0.5° C./min.

Embodiments 12 to 16, Comparative Examples 12 and 13

Wafers having the same nitrogen concentration and oxygen concentration as Embodiment 5 were inserted into a vertical heat-treatment furnace in which the temperature was maintained at 600° C. In the furnace, these wafers were heat-treated in an argon atmosphere, while the temperature-increasing rate was changed in stepwise, from 0.5° C./min to 3.5° C./min, each time by 0.5° C./min. Thus, there were prepared some samples. The heat treatment was carried out in the same conditions as in Embodiments 1 to 7. That is, the wafers were heat-treated for 60 minutes, gradually heated to 1200° C.

The wafers so heat-treated were subjected to the same BMD-inducing process as Embodiments 1 to 7 were subjected. The wafers were then evaluated for their within-wafer uniformity of BMD density, by means of X-ray topography method. The results were as shown in Table 4.

TABLE 4

|  | Rate of temperature increase (° C./min) | BMD-density distribution measured by X-ray topograph |
| --- | --- | --- |
| Embodiment 12 | 0.5 | Uniform |
| Embodiment 13 | 1.0 | Uniform |
| Embodiment 14 | 1.5 | Uniform |
| Embodiment 15 | 2.0 | Uniform |
| Embodiment 16 | 2.5 | Uniform |
| Comparative Example 12 | 3.0 | Not uniform |
| Comparative Example 13 | 3.5 | Not uniform |

As Table 4 reveals, wafers having the same nitrogen concentration and oxygen concentration as Embodiment 5 can have within-wafer uniformity of BMD density if they are heated at the rate of 0.5 to 2.5° C./min, even if the BMD-density distribution is evaluated by X-ray topography method.

It goes without saying that various obvious modifications and simple variants come within the scope of the present invention beyond the above-described embodiments.

What is claimed is:

1. A process of producing a silicon wafer from a single-crystal including a ring-shaped OSF region and having a predetermined nitrogen concentration and a predetermined oxygen concentration prepared by the Czochralski method in a reducing-gas or inert-gas atmosphere, comprising:

inserting a silicon wafer including the ring-shaped OSF region and having the nitrogen concentration ranging from $2.9 \times 10^{14}$ to $5.0 \times 10^{15}$ atoms/cm$^3$ and the oxygen concentration of $1.27 \times 10^{18}$ to $3.0 \times 10^{18}$ atoms/cm$^3$, into a heat-treatment furnace in which the temperature was maintained at 600 to 800° C. in the reducing-gas or inert-gas atmosphere; and heat-treating the wafer, while maintaining the rate of increasing the temperature at 0.5° C./min to 2.0° C./min until the wafer is heated to a heat-treatment temperature of 1000 to 1200° C.

2. A process of producing a silicon wafer from a single-crystal including a ring-shaped OSF region and having a predetermined nitrogen concentration and a predetermined oxygen concentration prepared by the Czochralski method in a reducing-gas or inert-gas atmosphere, comprising:

inserting a silicon wafer including the ring-shaped OSF region and having the nitrogen concentration ranging from $4.4 \times 10^{14}$ to $5.0 \times 10^{15}$ atoms/cm$^3$ and the oxygen concentration of $1.15 \times 10^{18}$ to $3.0 \times 10^{18}$ atoms/cm$^3$, into a heat-treatment furnace in which the temperature was maintained at 600 to 800° C. in the reducing-gas or inert-gas atmosphere; and heat-treating the wafer, while maintaining the rate of increasing the temperature at 0.5° C./min to 2.0° C./min until the wafer is heated to a heat-treatment temperature of 1000 to 1200° C.

3. A process of producing a silicon wafer from a single-crystal including a ring-shaped OSF region and having a predetermined nitrogen concentration and a predetermined oxygen concentration prepared by the Czochralski method in a reducing-gas or inert-gas atmosphere, comprising:

inserting a silicon wafer including the ring-shaped OSF region and having the nitrogen concentration ranging from $8.0 \times 10^{14}$ to $5.0 \times 10^{15}$ atoms/cm$^3$ and the oxygen concentration of $1.35 \times 10^{18}$ to $3.0 \times 10^{18}$ atoms/cm$^3$, into a heat-treatment furnace in which the temperature was maintained at 600 to 800° C. in the reducing-gas or inert-gas atmosphere; and heat-treating the wafer, while maintaining the rate of increasing the temperature at 0.5° to 2.5° C./min until the wafer is heated to a heat-treatment temperature of 1000 to 1200° C.

* * * * *